(12) United States Patent
Leung et al.

(10) Patent No.: US 8,194,411 B2
(45) Date of Patent: Jun. 5, 2012

(54) ELECTRONIC PACKAGE WITH STACKED MODULES WITH CHANNELS PASSING THROUGH METAL LAYERS OF THE MODULES

(75) Inventors: Chi Kuen Vincent Leung, Hong Kong (HK); Peng Sun, Hong Kong (HK); Xunqing Shi, Hong Kong (HK); Chang Hwa Tom Chung, Hong Kong (HK)

(73) Assignee: Hong Kong Applied Science and Technology Research Institute Co. Ltd, Hong Kong (HK)

( * ) Notice: Subject to any disclaimer, the term of this patent is extended or adjusted under 35 U.S.C. 154(b) by 430 days.

(21) Appl. No.: 12/415,416

(22) Filed: Mar. 31, 2009

(65) Prior Publication Data

US 2010/0246141 A1 Sep. 30, 2010

(51) Int. Cl.
*H05K 1/18* (2006.01)
(52) U.S. Cl. ...................................................... 361/761
(58) Field of Classification Search .......... 361/728–735, 361/743, 760; 174/262, 350; 257/678, 686, 257/777; 156/245
See application file for complete search history.

(56) References Cited

U.S. PATENT DOCUMENTS

| | | | |
|---|---|---|---|
| 5,128,831 A | 7/1992 | Fox, III et al. | |
| RE36,916 E * | 10/2000 | Moshayedi | 257/723 |
| 6,469,374 B1 | 10/2002 | Imoto | |
| 6,951,982 B2 * | 10/2005 | Chye et al. | 174/350 |
| 7,049,528 B2 | 5/2006 | Kariya et al. | |
| 7,279,786 B2 | 10/2007 | Kim | |
| 7,285,847 B2 * | 10/2007 | Lee | 257/686 |
| 7,317,256 B2 | 1/2008 | Williams et al. | |
| 7,420,814 B2 * | 9/2008 | Kim et al. | 361/735 |
| 7,450,395 B2 * | 11/2008 | Sakai | 361/760 |
| 2002/0126459 A1 * | 9/2002 | Albert et al. | 361/743 |
| 2007/0216004 A1 | 9/2007 | Brunnbauer et al. | |
| 2008/0169546 A1 | 7/2008 | Kwon et al. | |
| 2008/0290492 A1 | 11/2008 | Chung et al. | |
| 2008/0308921 A1 | 12/2008 | Kim | |

FOREIGN PATENT DOCUMENTS

| | | |
|---|---|---|
| JP | 2000183283 A | 6/2000 |
| WO | 03046987 A1 | 6/2003 |

OTHER PUBLICATIONS

International Search Report and the written opinion of the international searching authority, or the declaration dated Jan. 7, 2010 for PCT/CN2009/071083 in 14 pages.

* cited by examiner

*Primary Examiner* — Chandrika Prasad
(74) *Attorney, Agent, or Firm* — Syndicated Law PC; Brian S. Boyer

(57) ABSTRACT

One aspect of the present invention provides an electronic package, comprising at least a first module and a second module arranged on top of the first module, the modules together in the form of a module stack, wherein the first and second modules are adhesively connected together, each module includes a substrate layer having at least one metal layer, at least one die and a plastic(s) package molding compound layer molded over said die or dice, in each module the die or dice are bonded on said substrate layer via the metal layer, a plurality of channels formed generally vertically acting as vias to connect the metal layers and arranged adjacent to the die or dice in at least one of the modules, some or all the channels provided with an inner surface coated with a conductive material layer or filled with a conductive material for electrical connection whereby the dice are electrically connected together, and means serving as an intermediary for providing electrical, mechanical and thermal connectivity, communication externally and connected to the channels.

11 Claims, 11 Drawing Sheets

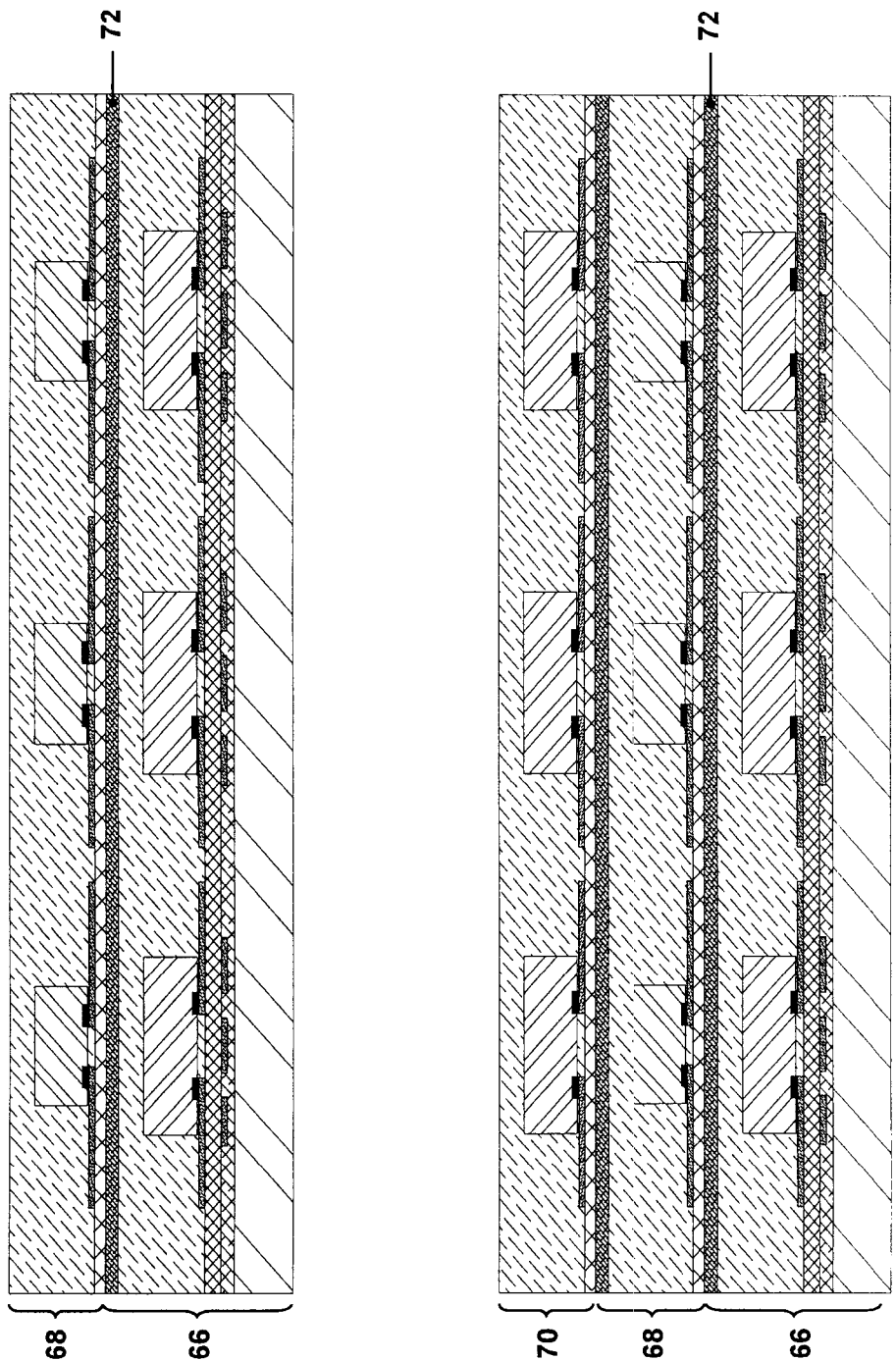

ELECTRONIC PACKAGE WITH STACKED MODULES WITH CHANNELS PASSING THROUGH METAL LAYERS OF THE MODULES

FIELD OF THE PRESENTION INVENTION

The present invention is concerned with an electronic package, an electronic package assembly and a method of fabrication thereof.

BACKGROUND OF THE PRESENT INVENTION

Electronic packages containing multiple chips are not new. Electronic packages may be classified into different ways. For example, some prior art electronic packages can be classified to include but not limited to (i) wire bonding (WB) die stacking, (ii) package-on-package or package stacking (PoP) and (iii) through-silicon-via (TSV). While these different classes of electronic packages may be advantageous in some ways, they are often deficient in others. For example, although WB die stacking may be considered relatively simple conceptually in their structure and is relatively mature as a technology their signal performance (due to the requirement of using a large amount of external wire connections), form factor and testability is generally considered to be unsatisfactory. Also, WB die stacking often results a rather bulky package which would be undesirable in compact electronic device environment. PoP may have a better testability but still their electrical performance and form factor are also not satisfactory. Prior art TSV based die stacking packages have better electrical performance and form factor but yet they suffer from poor testability and high manufacturing cost due to complications in their fabrication.

The present invention seeks to provide a type of three-dimensional electronic package which can address some if not all the above problems, or at least to provide the general public with an alternative.

SUMMARY OF THE PRESENT INVENTION

According to a first aspect of the present invention, there is provided an electronic package, comprising at least a first module and a second module arranged on top of the first module, the modules together in the form of a module stack, wherein the first and second modules are adhesively connected together, at least one of the modules includes a substrate layer having at least one metal layer, at least one die and a plastic(s) package molding compound layer molded over the die or dice, in the at least one of the modules the die or dice are bonded on the substrate layer via the metal layer, a plurality of channels formed generally vertically acting as vias to connect the metal layer and arranged adjacent to the die or dice in the at least one of the modules or in the module stack, some or all the channels provided with an inner surface coated with a conductive material layer or filled with a conductive material for electrical connection whereby the dice are electrically connected together, and means serving as an intermediary for providing electrical, mechanical and thermal connectivity, communication externally and connected to the channels. While the first and second modules are connected together adhesively, this would often mean that they are also mechanically and electrically connected together. The electronic package as described has a relatively simple which leads to a more reliable performance.

Preferably, the second module may be provided with a lower surface connected to an upper surface of the first module, with the lower surface being substantially planar and free of recesses. The absence of recesses allows manufacture thereof to be relatively easy, of lower cost and predictable.

In some embodiments, while the dice in one module and the dice in another module from above or below may share a similar physical profile in terms of size and shape, they do not have to share the same profile. More specifically, dice of different kinds, functionalities or sizes may be stacked together. For example, a logic chip in some module may be arranged above a memory chip on another module from below.

In some embodiments, one or more of the channels may extend across a substantial height of the module stack.

One or more of the channels may have a generally cylindrical, triangular prism or rectangular prism profile to suit a specific need.

Preferably, the channels may be formed by mechanical drilling or laser drilling.

In a preferred embodiment, wherein when the inner surface of some or all of the channels is coated by said conductive material layer, the conductive material layer may be coated on the inner surface of the channels by a single step of electroplating. Alternatively, some or all of the channels may be filled entirely with a conductive material. Yet alternatively, the inner surface of some or all of the channels may be filled with a conductive material layer followed by a step of filling the channels with a non-conductive material.

The intermediary may be a bonding pad. The intermediary may be arranged at a bottom surface of the electronic package.

According to a second aspect of the present invention, there is provided an electronic package assembly, comprising a plurality of electronic packages, at least one of which is an electronic package as described above.

According to a third aspect of the present invention, there is provided a method of fabrication of an electronic package assembly or an electronic package, comprising the steps of (a) providing a substrate layer supported on a holding means, (b) bonding a plurality of dice on the substrate layer, with the dice separated by a predetermined distance and at pre-determined locations on the substrate layer, (c) over-molding a plastic(s) package molding compound over the dice and forming a first module, (d) forming a second module by repeating steps (a) to (c) but without introducing the holding means or with the holding means layer removed therefrom, (e) stacking the second module on the first module in a predetermined configuration and bonding the modules together, forming a module stack, (f) placing a film on the module stack for patterning and patterning the module stack, (g) forming substantially vertical channels through the module stack at locations whereby metal layers on which the dice rest are connected, and (h) coating inner surface of some or all of the channels with a conductive material layer or filling some or all the channels with a conductive material.

Preferably, the holding means on which the first module is supported acts as a holder.

Suitably, the dice may be bonded to the substrate at the metal layers via inner bonding pads.

Preferably, the channels may be formed by mechanical drilling or laser drilling.

After the module stack has been formed the holding means of the first module is removed, means serving as an intermediary connected to the channels for providing electrical, mechanical and thermal connectivity and for communication externally is exposed. The intermediary may be in the form of outer bonding pads arranged on a bottom surface of the first module.

Preferably, there may be provided with a step after the patterning of removing the film.

In some embodiments, while at least some of the dice on the second module are generally vertically aligned with the dice on the first module, they do not have to be.

After the electronic package assembly is formed, the assembly may be divided and individual electronic packages are formed.

In one embodiment, in step (h), when the inner surface of some or all of the channels is coated, the inner surface may be coated by a single step of electroplating. Specifically, after coating the inner surface with conductive material layer, the channels may be filled with a non-conductive material. Alternatively, in step (h) some or all of the channels may be filled with a conductive material only and without any coating.

In some embodiments, the dice in each module or the dice from different modules do not share the same profile.

BRIEF DESCRIPTION OF THE DRAWINGS

Some embodiments of the present invention will now be described by way of example and with reference to the accompanying drawings, in which:—

FIGS. 3a to 3g are a series of schematic diagrams showing fabrication of the electronic package assembly of FIG. 1;

DETAILED DESCRIPTION OF PREFERRED EMBODIMENTS OF THE PRESENT INVENTION

The prior art has disclosed many different types of electronic package system. For example, U.S. Pat. No. 5,128,831 discloses a package containing a stack of modules interleaved by spacers. U.S. Pat. No. 7,279,786 discloses a package on package system in which an upper substrate is provided with a recess at its bottom surface for accommodating one or more semiconductor die from below. U.S. Pat. No. 7,317,256 discloses an electronic device package containing dice, each of which has a through-silicon via formed therethrough and with two layers of the packaged connected by solder joints. US Patent Publication No. 2007/0216004 discloses a semiconductor device with chips thereon embedded in a plastic material. US Patent Publication No. 2008/0169546 discloses a semiconductor chip package stack showing one wafer mold stacked on top of the other. The present invention proposes a different electronic package which possesses advantages over the prior devices at least in some respects. For sake of clarity, it is to be noted that in this description electronic package and electronic package assembly carry generally the same meaning. It is also to be noted that for reason of brevity, contents in at least the above prior publications are not repeated but instead are included herein by reference in their entirety.

Figure 1:
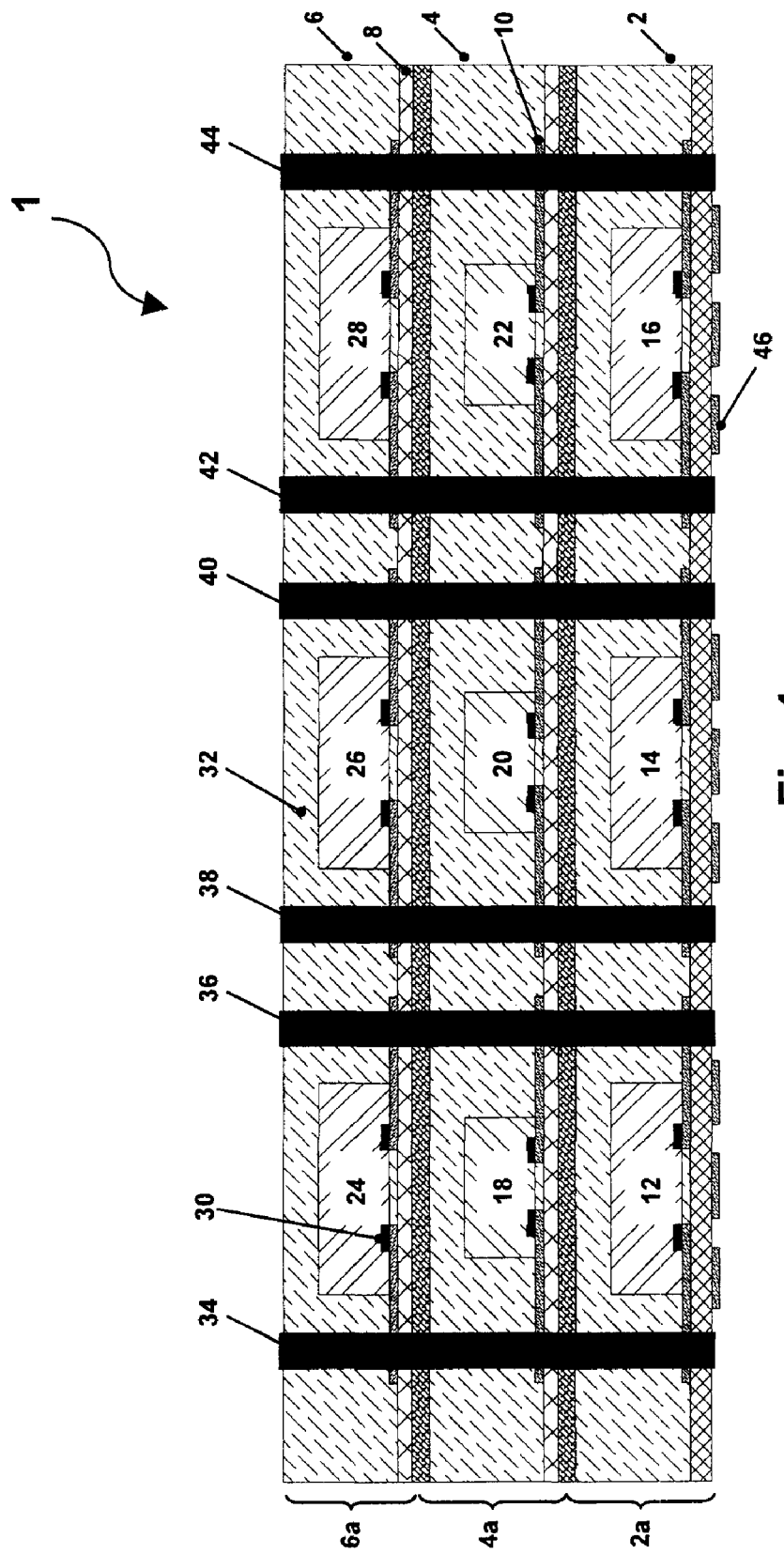
FIG. 1 is schematic diagram showing an embodiment of a three-dimensional electronic package assembly according to the present invention.

FIG. 1 schematically illustrates a first embodiment of an electronic package assembly 1 which has a three-dimensional structure. In this embodiment, the package assembly comprises three modules 2, 4, 6 which are generally in the form three layers. Specifically, the modules include a first layer 2a at the bottom, a second layer 4a in the middle and a third layer 6a on the top. In each module, there are generally provided a substrate 8 (which is generally planar acting as an interconnect layer) and a predefined metal layer 10 arranged on the substrate at predetermined locations. There is also provided a predetermined number of rows of dice separated by a predetermined distance on the substrate 8, with each row having three dice (e.g. 12, 14, 16 on the first layer). The dice are bonded to the metal layer 10 via inner bonding pads 30.

The modules are arranged in a configuration such that the dice in one module are arranged above the dice in the module therebelow such that the dice (when considered alone) are aligned and multiple columns of such dice are created. By "column of dice", it generally refers to at least two dice with one die in one module arranged above the other in the module from below. It is to be noted that while from FIG. 1 each column appears to have equally three dice it is however not necessarily the case in practice. In other embodiments, it is possible that some columns may have more dice than others. It is also possible that certain module(s) may have more dice than others. It is also to be noted that the dice in each column do not have to share the same physical form or configuration. FIG. 1 shows that the dice 18, 20, 22 in the second module have a smaller width than that the first and third modules 2, 6. In fact, the design of the electronic package assembly 1 in accordance with the present invention provides a large degree of freedom on the size of the dice and yet the cost of assembly of the modules still remains relatively low.

Each module layer includes a material 32 molded over the dice such that the dice are encapsulated between the molding material 32 and the substrate 8. The molding material in this embodiment is substantially organic plastic.

Across the package assembly, there is provided a plurality of channels 34, 36, 38, 40, 42, 44 which are vertically arranged. It is to be noted that the particular locations of the channels are such that they pass through and connect the metal layer 10 in each module. More specifically, there is a pair of channels (e.g. 34, 36) on opposite sides of each column of dice (e.g. 24, 18, 12). The channels can be considered as through-mold-via (TMV) which is relatively easy to form due to its substantially cylindrical profile and its passing through a substantial height of the modules stacked together. It is to be noted that while FIG. 1 only shows two channels 34, 36 on opposite sides of the dice 12, 18, 24, in practice there are or may be many such channels surrounding the dice 12, 18, 24. However, for brevity and clarity reason only the channels 34, 36 are shown.

The first module 2 is further provided with a bonding pad 46 at the bottom surface of the substrate and this bonding pad is an outer bonding pad. The lower ends of the channels 34, 36, 38, 40, 42, 44 actually are connected to the outer bonding pad 46 for providing electrical, mechanical and thermal connectivity. The channels are provided with an inner surface coated with a copper layer with high conductive properties. Thus, for example, heat can be dissipated from the dice to the external environment via the channels and the outer bonding pad. Electrical signals are of course transmissible along the channels to or from the outer bonding pad.

Figure 2:
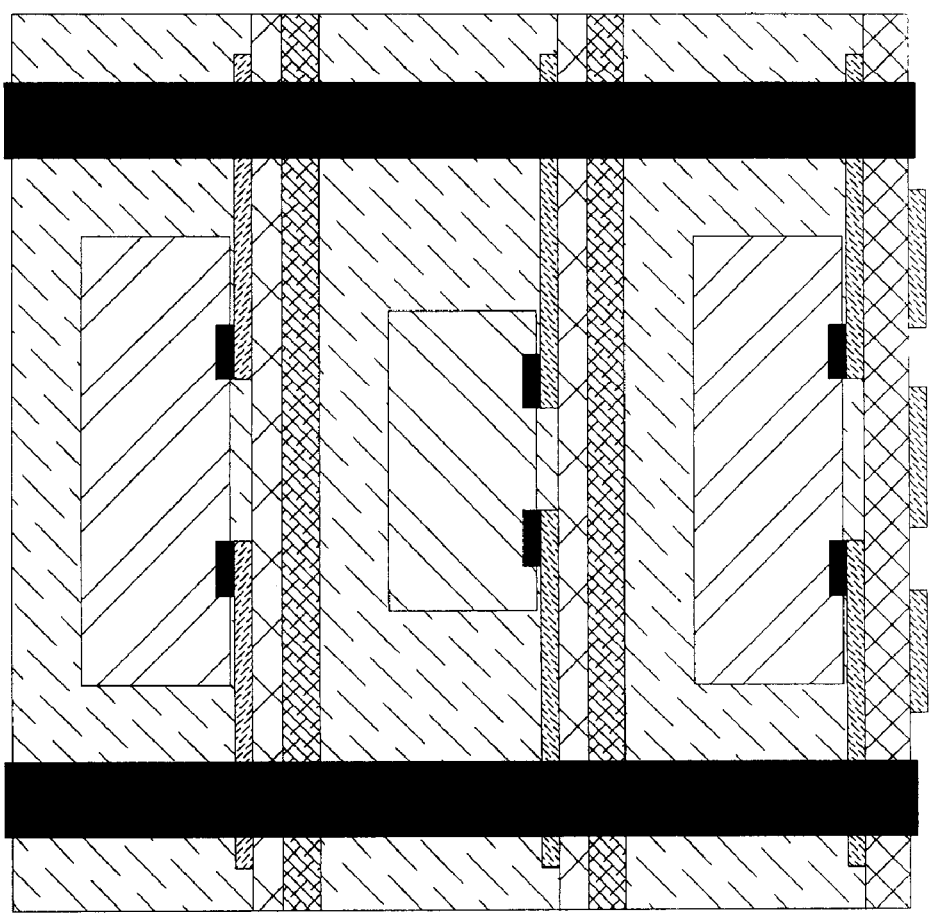
FIG. 2 is a schematic diagram showing an embodiment of an electronic package from the electronic package assembly of FIG. 1 according to the present invention.

FIG. 2 shows an electronic package divided from the electronic package assembly of FIG. 1 in accordance with another embodiment of the present invention.

Some common reliability problems associated with conventional electronic packages include pop-corn, stress due to low standoff and handling. With regard to the problem of pop-corn, studies have shown that industry standard baking method can be used to successfully remove the moisture before the reflow in the present invention. Testing studies on the electronic package of FIG. 2 shows that the problem of moisture is absent or negligible.

It is to be noted that electronic packages or assemblies which are complex in structure often do have reliability issues. The electronic package and electronic package assembly described above are actually relatively simple and studies have shown that minimal reliability issues have arisen. This may be due to the use of generally vertical interconnections between top and bottom layers, the generally planar bottom surface of each layer and the lack of the use of, for example, solder balls for connection purposes. The studies have also shown that electronic packages made in accordance in the present invention have a good balance of desirable characteristics (e.g. functionality/testability, form factor, electrical performance, wafer area usage, manufacturing cost and throughput). The following table summaries these characteristics in comparison with conventional packages made by PoP and TSV.

TABLE 1

Comparison of Characteristics of Different Types of Electronic Packages

| Technologies | Functionalities/ Testability | Form Factor | Electrical Performance | Wafer Area Usage | Manufacturing Cost | Throughput |
|---|---|---|---|---|---|---|
| PoP | More/Good | Big | Poor | Good | Low | Low |
| TSV | Less/Poor | Small | Excellent | Poor | High | High |
| Present Invention (TMV) | More/Good | Middle | Good | Good | Low | Middle |

From the above table, it is apparent that electronic packages made in accordance with the present invention have a good balance of characteristics.

Figure 3A:
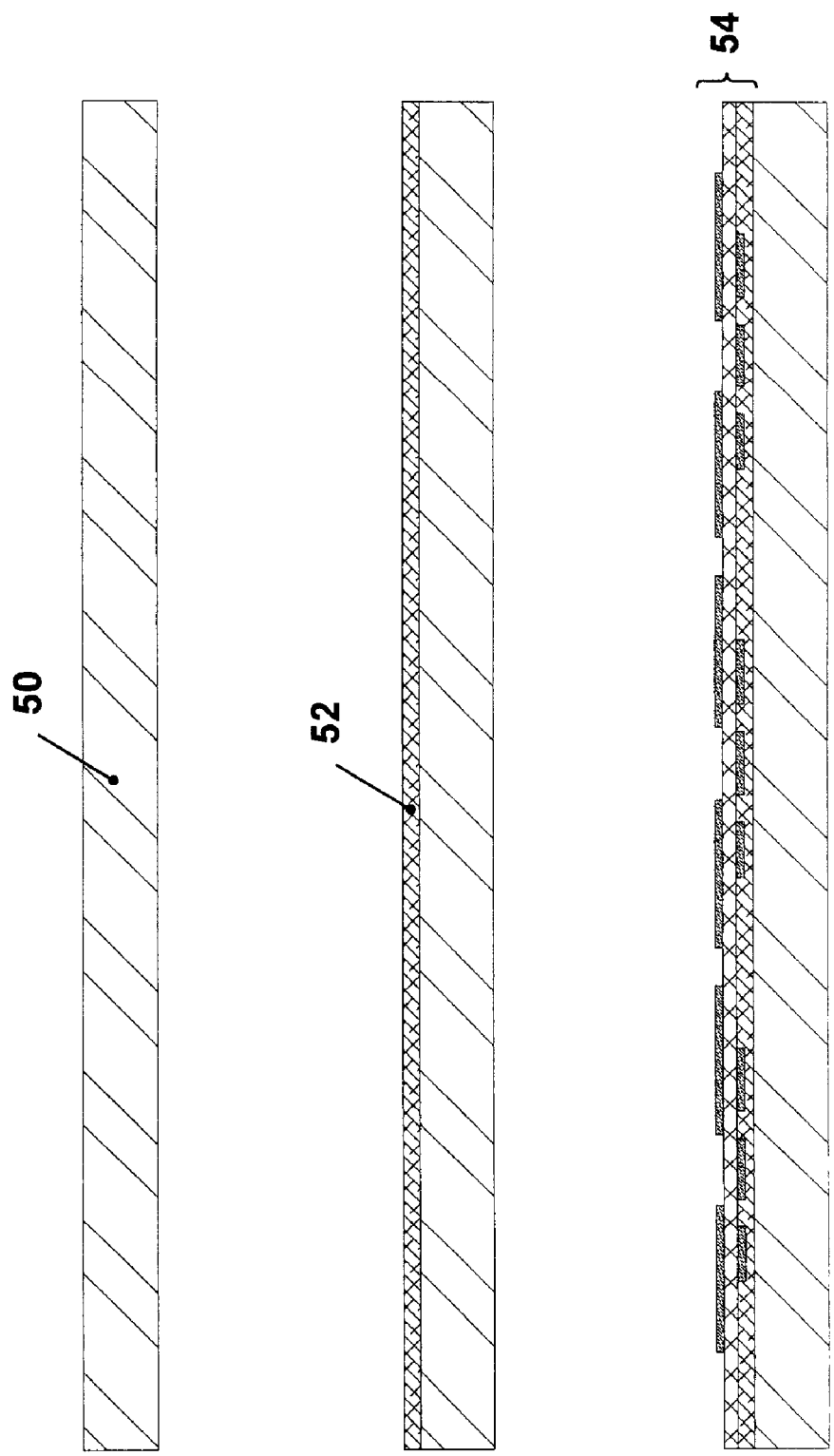

FIGS. 3a to 3g are concerned with yet another embodiment of the present invention. In this embodiment, there is illustrated a method for fabrication of, for example, an electronic package assembly 1 as described above. Referring firstly to FIG. 3a, there is provided a wafer holder 50. The use of the wafer holder 50 allows a reliable handling of the package as it is being fabricated. The wafer holder 50 is then applied with an adhesive 52 and then a pre-fabricated interconnect layer 54 is connected on the wafer holder 50.

Figure 3B:
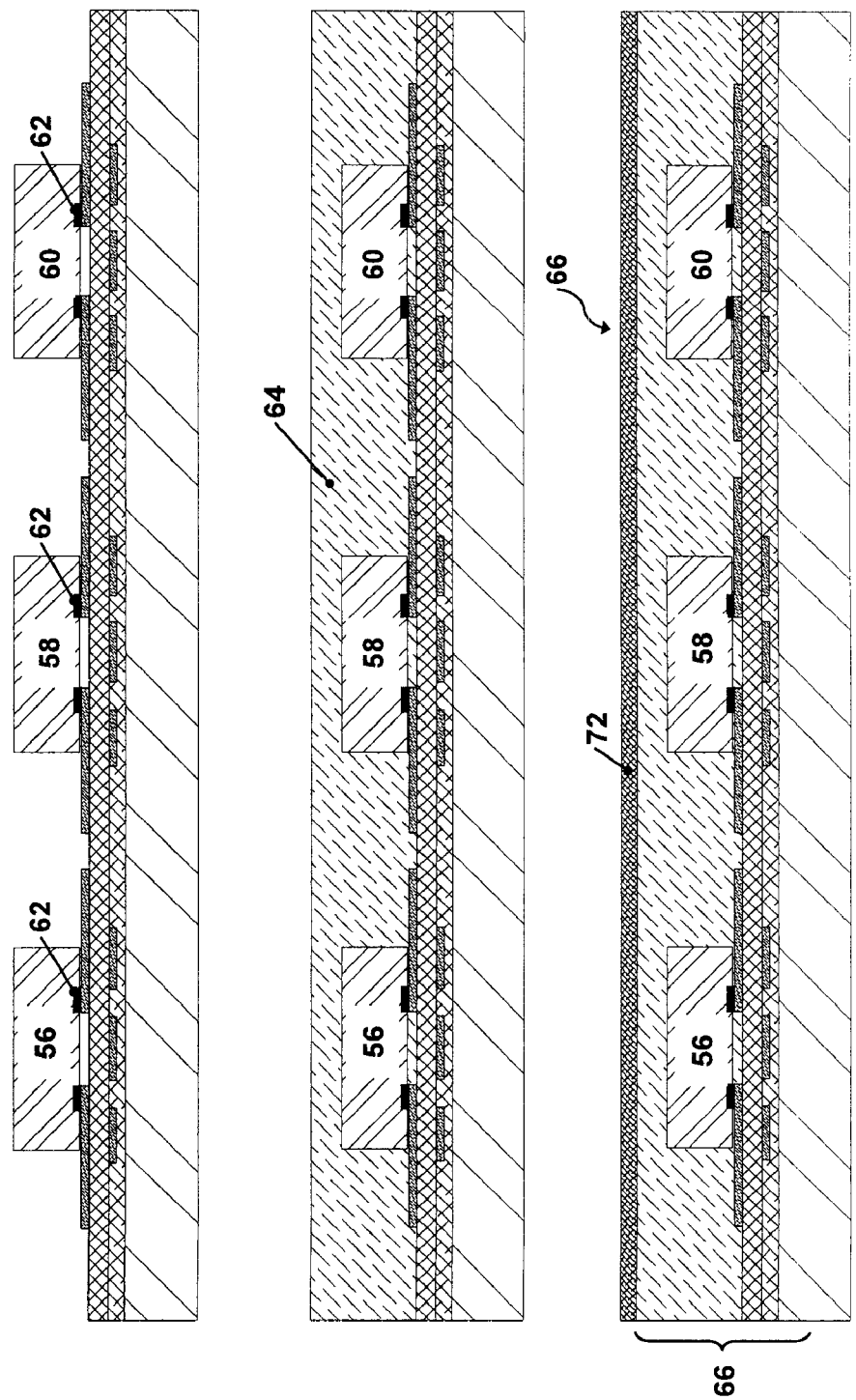

FIG. 3b illustrates that a plurality of dice 56, 58, 60 are then bonded to the interconnect layer 54 at pre-determined locations such that the dice are separated by a pre-determined distance. It can be seen that the dice are bonded to the interconnect layer 54 via a bonding pad or inner bonding pad 62. FIG. 3b further illustrates that an over-molding material 64 (BCB) is then applied by over-molding on the dice, thus encapsulating the dice on the wafer holder. The over-molding of the material 64 may be performed by using a mold for defining the shape of the desired the encapsulated dice. This encapsulated dice has formed a first layer or first module 66.

A second module 68 and a third module 70 are then similarly fabricated, except after they are formed the wafer holder is removed. Alternatively, they may be formed without the wafer holder at all. Please see FIG. 3c.

When each module has been made, it is firstly subjected to a testing step to ensure that it has met pre-defined testing parameters. The testing of individual modules separately is relatively easy. It is to also be noted that the fabrication of individual modules undergoes a uniform step and this makes large scale manufacture simple and cost effective.

Once the dice of the first module 66 have been over-molded and have taken shape, an adhesive is applied on top of the first module.

FIG. 3c illustrates that the second module 68 is then placed on top of and bonded to the first module. The wafer holder of the second module 68 is of course to be removed before it is bonded to the first module. It is to be noted that the dice in the first and second module stack 66, 68 are configured such that a plurality of columns of dice are provided with each die in the second module generally above and vertically align with a corresponding die in the first module. Again, by "column of dice", it generally refers to at least two dice with one die in one module arranged above and align with the other in the module from below. However, such alignment is not necessary. In other embodiments, the dice from one module may not align with the dice from the module from above or below. In such case, no distinct column of dice would be seen.

FIG. 3c further illustrates that the third module 70 is similarly placed on top of and bonded to the second module 68. Similarly, the dice in the module stack 66, 68, 70 are configured such that a plurality of columns of dice are provided with each die in the third module arranged above and vertically align with corresponding dice in the first and second modules. It is however to be noted that while there are equal number of dice in each die column in this embodiment, in alternative embodiments, this does not have to be the case. For example, in one die column there may be three dice while in another column there may be only one die. Further, the dice in each die column may have different functionalities. Regardless of the arrangement of the dice in the module stack, the functionalities of the dice or the number of die columns in the module stack, the electronic package that is finally formed has a relatively preferable form factor.

Figure 3D:
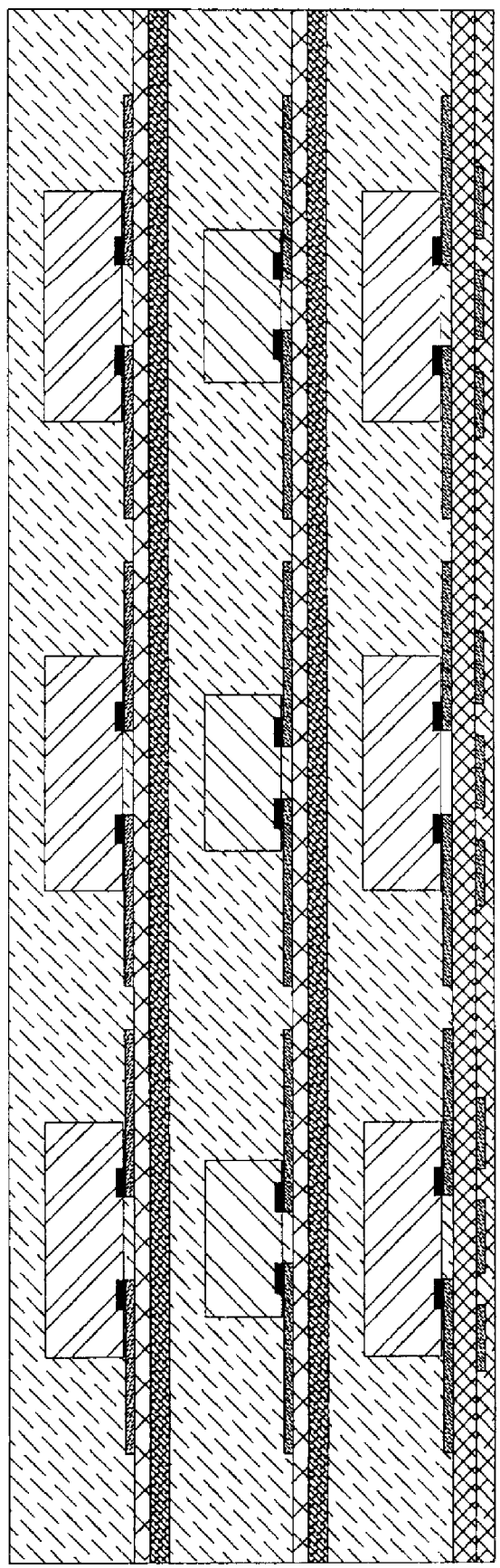

FIG. 3d illustrates that once the module stack with three die columns has been formed, the wafer holder is de-bonded and removed.

Figure 3E:
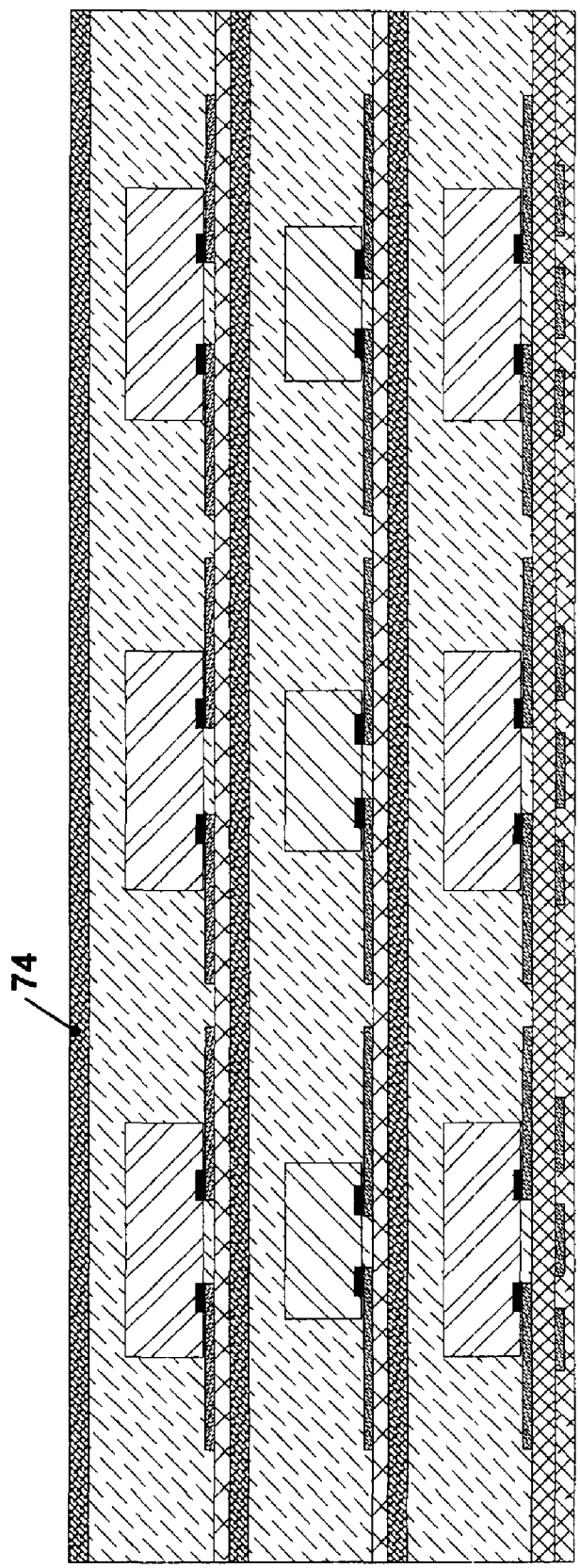

FIG. 3e illustrates that a film 74 is placed on top of the third module and then the film illuminated for patterning purposes.

Figure 3F:
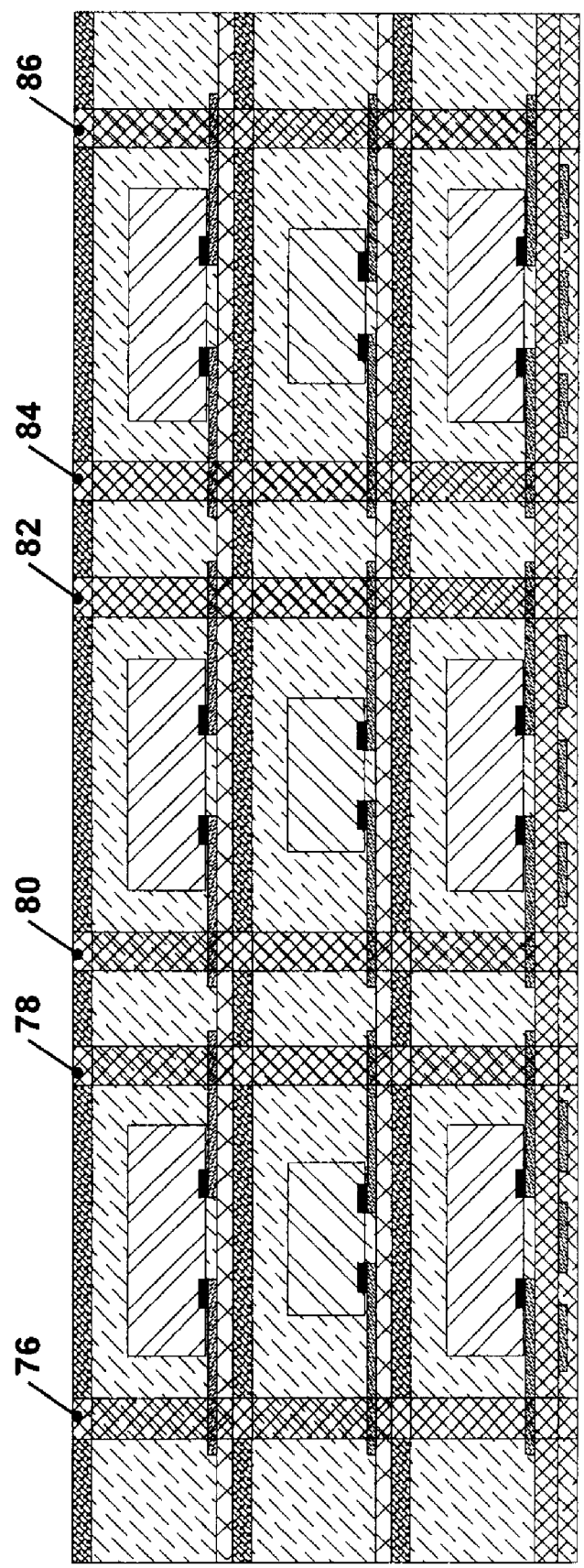

FIG. 3f illustrates that subsequently holes 76, 78. 80, 82, 84, 86 are drilled at pre-determined locations on the third modules through the module stack. The holes are substantially vertical and cylindrical in shape and they pass the metal layer on each module. It is schematically shown that each die column is sandwiched by a pair of the cylindrical hole (e.g. 76, 78). It is however to be noted that in other embodiments the number of holes may vary and can be many surrounding the columns of dice.

Figure 3G:
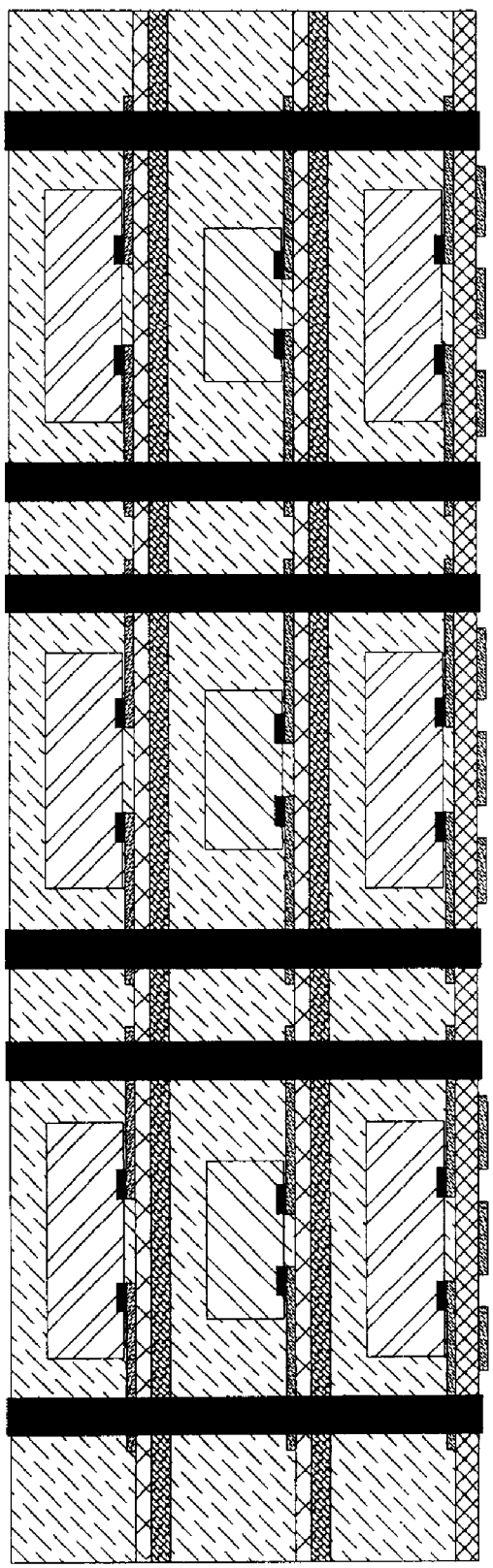

The holes provided with an inner surface are then electroplated with a copper later serving a conductive lining, as shown in FIG. 3g. It is understood that communication is established between the modules and the module stack and the external environment. This relatively simple connection allows much better electrical performance. Alternatively, the holes may be filled with a conductive material. Yet, alternatively, the holes may be coated with a layer of conductive material and filled with a non-conductive material.

Figure 4:
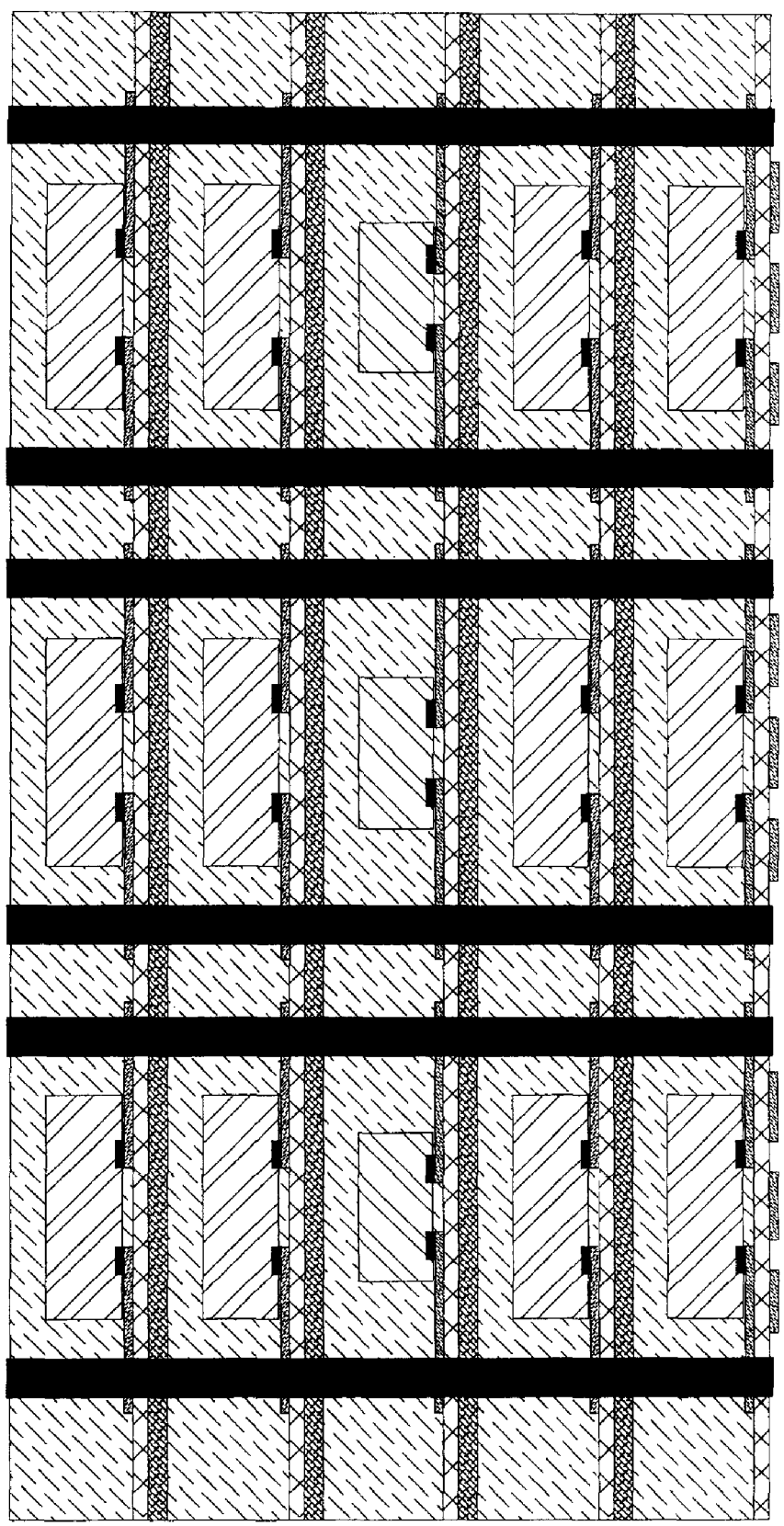
FIG. 4 is a schematic diagram showing another embodiment of a three-dimensional electronic package assembly according to the present invention.

While the electronic package assembly in the first embodiment has three layers of modules and three columns of dice, the present invention is of course not limited to this specific configuration. For example, an electronic package assembly having five layers of modules is equally possible, as shown in FIG. 4. From a mass production point of view, an electronic package assembly may be made to be of relative large size and with as many columns as possible because one assembly can yield many separate three-dimensional electronic packages.

Figure 5:
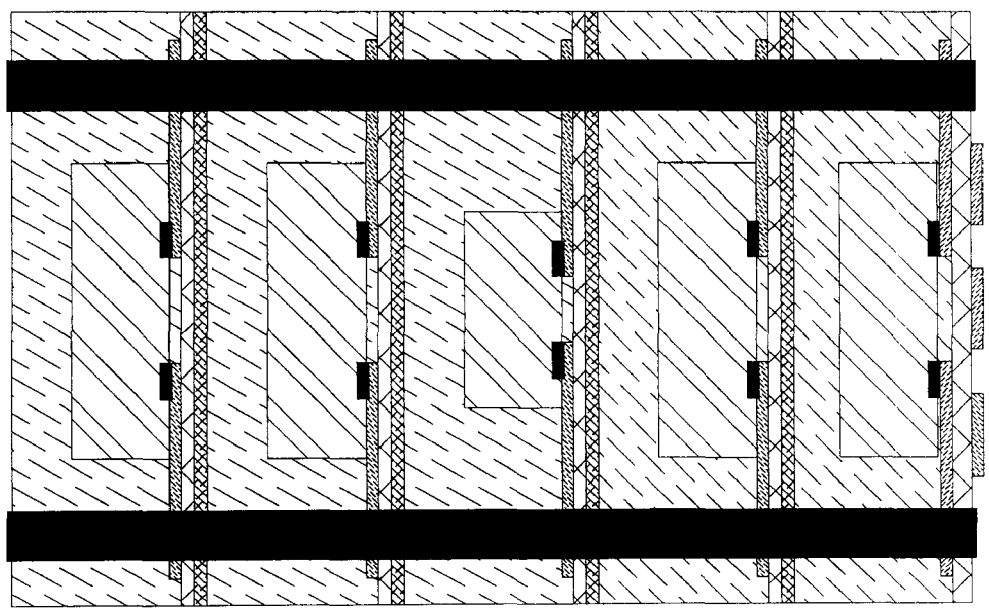
FIG. 5 is a schematic assembly showing an embodiment of an electronic package from the electronic package assembly of FIG. 4.

After the electronic package assembly has been fabricated in accordance with the above described method, a number of electronic packages may be formed from the assembly by cutting the assembly at predetermined locations. FIG. 5 shows one such electric package.

The invention claimed is:

1. An electronic package, comprising at least a first module and a second module arranged on top of said first module, the modules together in the form of a module stack; wherein,
    said first and second modules are adhesively connected together;
    at least one of said modules includes a substrate layer having at least one metal layer, at least one die and a plastic(s) package molding compound layer molded over said die or dice;
    in said at least one of said modules, said die or dice are bonded on said substrate layer via said metal layer;
    a plurality of channels formed generally vertically passing through the metal layer acting as vias to connect said metal layer of the at least one of said modules to the other of said modules and arranged adjacent said die or dice in said at least one of said modules or in said module stack, at least some of the channels passed through the module stack, some or all said channels provided with an inner surface coated with a conductive material layer or filled with a conductive material for electrical connection whereby said dice are electrically connected together; and
    an intermediary for providing electrical, mechanical and thermal connectivity, communication externally and connected to said channels.

2. An electronic package as claimed in claim 1, wherein said second module is provided with a lower surface connected to an upper surface of the first module, with said lower surface being substantially planar and free of recesses.

3. An electronic package as claimed in claim 1, wherein said dice in each said module stack do not share the same profile.

4. An electronic package as claimed in claim 1, comprising at least a logic chip and/or a memory chip.

5. An electronic package as claimed in claim 1, wherein one or more said channels extend across a substantial height of said module stack.

6. An electronic package as claimed in claim 1, wherein one or more said channels have a generally cylindrical, triangular prism or rectangular prism profile.

7. An electronic package as claimed in claim 1, wherein said channels are formed by mechanical drilling or laser drilling.

8. An electronic package as claimed in claim 1, wherein when said inner surface of said channels is coated by said conductive material layer, said conductive material layer is coated on said inner surface of said channels by a single step of electroplating.

9. An electronic package as claimed in claim 1, wherein said intermediary is a bonding pad.

10. An electronic package as claimed in claim 1, wherein said intermediary is arranged at a bottom surface of said electronic package.

11. An electronic package assembly, comprising a plurality of electronic packages, at least one of which is an electronic package as claimed in claim 1.

* * * * *